United States Patent [19]

Boulanger et al.

[11] Patent Number: 5,075,635
[45] Date of Patent: Dec. 24, 1991

[54] DEVICE FOR CORRECTING THE PHASE INDUCED BY THE CLASS C OPERATION OF THE SOLID STATE AMPLIFIER AND RADAR SYSTEM USING SUCH A DEVICE

[75] Inventors: Alain Boulanger, Brest; Jacques Creff, Plouarzel, both of France

[73] Assignee: Thomson-CSF, Puteaux, France

[21] Appl. No.: 536,632

[22] PCT Filed: Dec. 17, 1989

[86] PCT No.: PCT/FR89/00592

§ 371 Date: Jun. 27, 1990

§ 102(e) Date: Jun. 27, 1990

[87] PCT Pub. No.: WO90/06625

PCT Pub. Date: Jun. 14, 1990

[30] Foreign Application Priority Data

Nov. 25, 1988 [FR] France .................... 88 15411

[51] Int. Cl.⁵ .................................. H03F 1/36
[52] U.S. Cl. .................................. 330/149; 330/107
[58] Field of Search ............. 307/262; 330/107, 109, 330/294, 302, 149; 333/161, 164, 120

[56] References Cited

U.S. PATENT DOCUMENTS

| | | | |
|---|---|---|---|
| 3,346,822 | 10/1967 | Levy et al. | 333/164 X |
| 4,122,399 | 10/1978 | Heiter et al. | 330/149 |
| 4,276,514 | 6/1981 | Huang | 330/149 |
| 4,554,514 | 11/1985 | Whartenby et al. | 330/149 |
| 4,600,892 | 7/1986 | Wagner et al. | 330/149 X |

FOREIGN PATENT DOCUMENTS 0248425 12/1987 European Pat. Off. .

OTHER PUBLICATIONS

Electronics Letters, vol. 7, No. 7, 8 Apr. 1971, Hitchin GB pp. 145-146, T. Arthanayake et al.: "Linear Amplification Using Envelope Feedback", p. 145.

Primary Examiner—Steven Mottola
Attorney, Agent, or Firm—Oblon, Spivak, McClelland, Maier & Neustadt

[57] ABSTRACT

The present invention relates to a device for correcting the phase induced by the class C operation of a solid state amplifier. It is applied in the field of the manufacture of pulse radar transmitters. Solid state amplifiers are prone to generating phase variations. The invention relates to a measurement and correction loop which allows the real time elimination of phase variations due to heating up.

8 Claims, 3 Drawing Sheets

DEVICE FOR CORRECTING THE PHASE INDUCED BY THE CLASS C OPERATION OF THE SOLID STATE AMPLIFIER AND RADAR SYSTEM USING SUCH A DEVICE

BACKGROUND OF THE INVENTION

1. Field of the Invention

The present invention relates to a device for correcting the phase induced by the class C operation of a solid state amplifier. It is applied in the field of the manufacture of pulse radar transmitters.

2. Background Discussion

In modern radars, the transmitted electromagnetic waves are generated by a device based on semiconductor components using microwave frequency transistors. The characteristics of the radar are directly related to the transfer function. Now, the latter depends on the operating conditions of the system.

In most radar applications, the Doppler effect affects the signals returned by moving targets, allowing the elimination of fixed echoes. Thus, in the case of a pulse compression radar, a frequency shift due to the Doppler effect is added to the phase or frequency encoding.

Now, the quality of the pulse compression radar essentially depends upon the ability to provide a receiving system whose transfer function is strictly the reverse of that of the transmission system. When working with solid state power stages, the amplification stages work in Class C. The peak powers are lower than in the case technologies based on valves (klystrons, Standing Wave Tubes, etc.) but the medium power developed can be high in order to allow a suitable form factor.

The desired powers are obtained by grouping power stages, controlled by low level transistors, in cascade. The final power is obtained by adders (Wilkinson circuits, 3 dB rings, ... ). These circuits always allow a sufficient power to be maintained even in the case of the failure of several stages which are automatically replaced.

However, power semiconductors are subject to two types of negative phenomena when used in pulse radars. Firstly, the instantaneous power varies during the pulse. Then, the phase varies.

During the progress of the invention, it was discovered that these phenomena were due to considerable variations in the junction temperature of the power transistors in the final stages. In pulse class C, the junctions change from zero dissipation before the rise of the pulse to maximum dissipation when the pulse power is at its maximum value. Now, the efficiency of transistors in this range being of the order of forty per cent, the heat dissipation is high during the duration of the pulse. The junction/casing thermal resistance of each transistor, however low it may be, results in the temperature varying during the pulse instead of remaining constant according to perfect radar theory.

As, in addition, the radars can work in frequency excursion mode or in frequency diversity mode or in a random wobbulated frequency mode to avoid countermeasures, the temperature variations become inhibitory.

In fact, they are responsible for variations in the phase and amplitude of the transmitted signal. In Doppler processing, the problem is further increased by the fact that the radar creates a band of parasitic Doppler frequencies.

The obvious solution which consists in cooling the junctions of the transistors during the relaxation between two pulses cannot be applied here since the widths of the pulses and the relaxation durations can vary considerably with no direct relationship between them.

SUMMARY OF THE INVENTION

It is an object of the present invention to allow an effective control of the phase of the output signal of the power stages of a solid state amplifier operating in class C, even when the the repetition rates are not constant nor even continuously variable.

Another object of the present invention is to propose a simple means of allowing a correction of the transfer function of the radar system which considerably reduces the phase variations in the transmitted pulse whatever the parameters of the system may be: frequency agility or wobbulation in particular. In fact, the present invention relates to a device for correcting the phase induced by the class C operation of a solid state amplifier of pulse signals. The invention is characterized in particular by the fact that the amplification system to be corrected comprises a phase shifter disposed at the input of the amplifier which can be controlled by the measurement of the instantaneous phase difference between the input voltage and the output voltage of this amplifier.

BRIEF DESCRIPTION OF THE DRAWINGS

Other characteristics and advantages of the present invention will appear more clearly with the help of the description and of the figures in which.

DETAILED DESCRIPTION OF THE PREFERRED EMBODIMENTS

Figure 1:
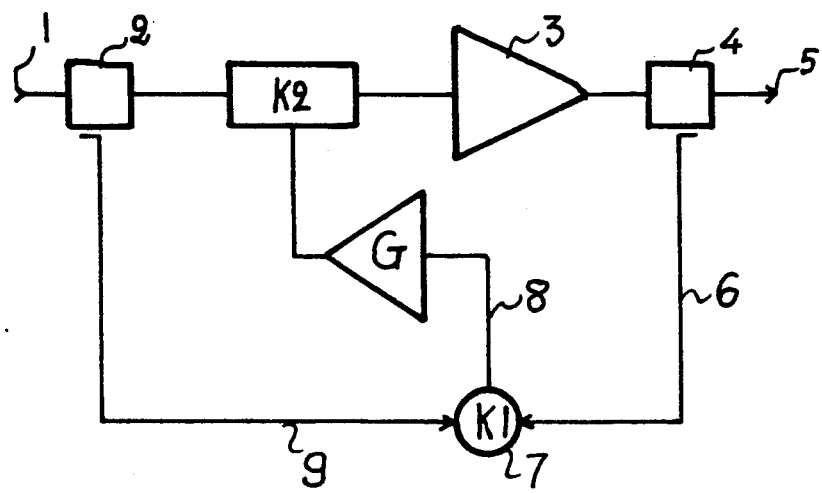
FIG. 1 is a functional block diagram of the principle of the invention.

In FIG. 1 there has been shown a block diagram of a system for the reduction of the phase created in the pulse power stages according to the invention. The input signal 1 is acquired by a coupler 2. The signal is then supplied to a controllable phase shifter K2 which drives the pulse power stage 3. The output of the latter is connected to an output coupler 4 which transmits the output signal 5 and a signal at 6 to the phase correction loop.

The loop is closed by a phase detector K1 which generates the signal of the phase difference between the two couplers 2 and 4. The difference signal is transmitted by the path 8 through a matching amplifier G to the phase control input of the controllable phase shifter K2.

This phase-shifter/phase-detector/amplifier loop constitutes the measurement and correction system for the phase drifts induced by the solid state power stages.

Figure 2:
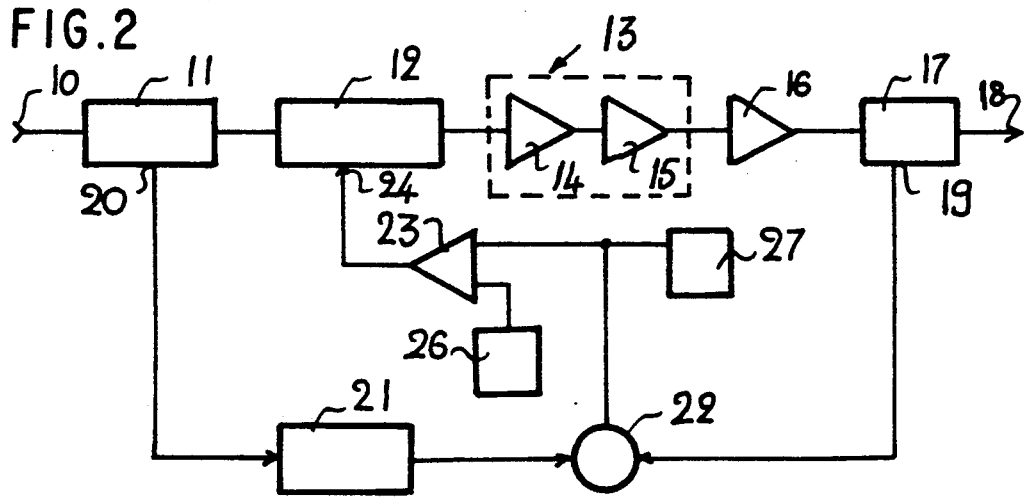
FIG. 2 is a general block diagram of a pulse amplification system using solid state technology having several stages with the device according to the invention.

In an embodiment shown in FIG. 2, the amplifier G is replaced by a differential amplifier 23 which also has a function in producing the phase correction.

The input signal 10 is supplied to a coupler 11 and then to a phase shifter 12 whose phase is controlled by its input 24. The amplification system is constituted by a low level amplifier 13 constituted from several cascaded elements 14 and 15 and an actual power amplifier 16. An output coupler 17 supplies the output signal 18. According to the principle indicated in FIG. 1, the correction loop is formed by a sensing 20 of the phase of the input signal by the input coupler 11 to which there is applied an equalizing delay by a delay line 21. In fact, it is known that the power amplification of a microwave frequency signal results in a propagation delay. In order to balance out this delay, it is necessary to insert a delay line in the reference channel of the phase detector.

The sensing signal is then compared by a phase detector 22 with the phase of the output signal taken from the output coupler 17 at its output 19.

The replacement of the amplifier G by a more complex system allows another problem brought about by the specific nature of the invention to be solved. This variant is shown in an embodiment in FIG. 2.

In a frequency agility mode, the phase difference between the two signals must be maintained in absolute value within the convergence range of the loop. But, not only does the delay manifest in phase on the signal, but also in group propagation. In order to adjust for these delays, it is necessary to shift the working point of the correcting loop with respect to the pre-polarization point corresponding to pure phase correction.

For this purpose, a differential amplifier 23 is supplied with a pre-polarizing voltage input signal which fixes the median point of the control characteristic in such a way that the phase shifter 12 can introduce a phase delay or a phase advance. In the case in which this group delay correction can no longer be compensated for without risking leaving the convergence zone of the loop, it is then necessary to have dedicated correcting cells, which are components known to those skilled in the art, in this type of delay.

In a first embodiment, this structure for the correction of group propagation time is inserted in the reference channel of the phase detector with a given sign.

In a second embodiment, these group delay correction cells are directly introduced in the amplification system. The sign of the correction is then inverted.

From the input sensor 11, it can be seen in FIG. 2 that the output 20 of this sensor is supplied to the input of a delay line 21.

Similarly, an output coupler 17 samples a signal 19 which is mixed with the signal sampled at the input and delayed in a phase detector 22. The mixed signal is supplied to the input of the amplifier 23 connected as a comparator with the pre-polarization voltage. The resultant signal of the comparison is applied to a diode phase shifter 12 at its control input 24. The output of the phase shifter 12 is supplied to the amplification system 13. The latter is composed of low level amplifiers 14, 15 which take the processed signal to an average power level, and then to a high power solid state amplifier 16.

Any drift due to the abovementioned effects will be taken into account, detected at the output coupler 17, and returned as a control signal to the phase shifter 12.

Figure 3:
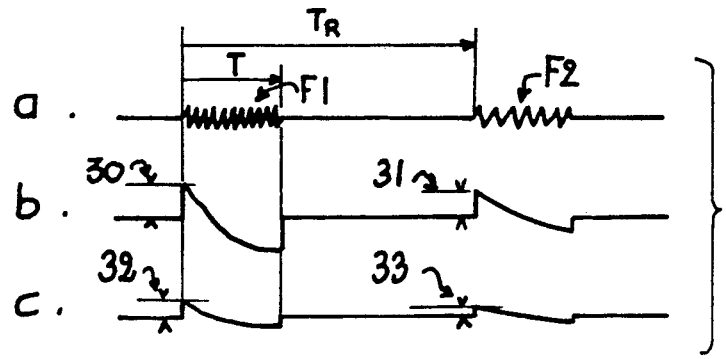
FIG. 3 is a timing diagram associated with the functioning of the figure.

In FIG. 3 there has been shown the timing diagrams of three characteristics signals of the invention. The signal a. is the input signal in the power amplifier which is operating in class C. It is constituted by a series of pulses of which the Nth is of duration T and the (N+1)th is separated from the previous one by a period TR. In frequency agility mode, the first train of pulses is at a frequency F1 and the second is at a frequency F2.

It is the instantaneous measurement of the group propagation time at the level of the solid state amplifier operating in class C which enables the adjustment of the phase shift and the measurement of the group time variation in the operating frequency range.

The curve b. thus measures the phase shift which would be produced in the open loop transfer. There can be observed the large amplitude of the phase shift introduced by the amplifier and its variation from a repetition at F1 to another repetition at F2. The curve c. measures the same phase shift in closed loop. There can be observed the reduction in the variations and a relative insensitivity to the repetition frequency.

Figure 4:
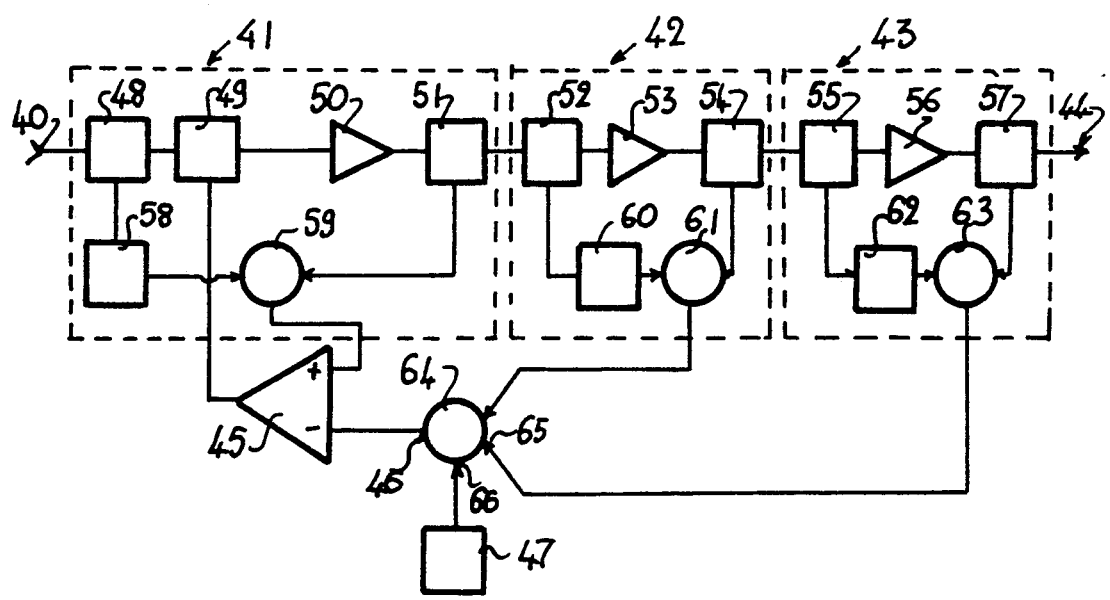
FIG. 4 is a block diagram of another embodiment of the radar system according to the invention.

In FIG. 4 there has been shown another embodiment of the invention. The input signal is supplied to a terminal 40 of the amplification circuit at the level of the input of the so-called medium power section. The amplification circuit is then divided into three sections: 41 called the medium power section, 42 called the high power section and 43 called the booster section respectively. This power staging enables a readjustment of the drifts related to each amplification class in a more precise manner than the overall correction provided for in FIGS. 1 or 2.

Each amplifier 50, 53, 56 is characterized by a propagation delay called T1 at low power, T2 at high power and T3 at very high power. These delays are compensated for by delay lines in the measurement channels belonging to each power level. Thus, the input and output signals of each of the levels 41, 42, 43 are sampled on couplers 48, 52, 55 at the input and 51, 54, 57 at the output. In each level, the sampled input signal is transmitted by a delay line 58 of value T1, 60 of value T2 and 62 of value T3.

A phase detector belonging to each level, 59, 61 and 63 respectively, then generates the error signal due to each amplification zone 41, 42, 43. The phase shift signals are composed in an adder 45, 64 with weighting coefficients which characterize the power level of the phase shift signal of each level. Furthermore, a presetting voltage source 47 supplies a pre-polarization signal similar to that of the circuit in FIG. 2, through a dedicated input 66 of the adder 64. The partial additional signal of the very high power and high power levels is added to the drift signal coming from the phase detector 59 of the medium powers and the resultant signal is supplied to a single phase shifter 49 inserted upstream of the medium power amplifier 49. The result is completely consequential. In fact, the power excursion is reduced in the section 41 and any correction in this section is much faster and therefore much more efficient than in the following sections.

Figure 5:
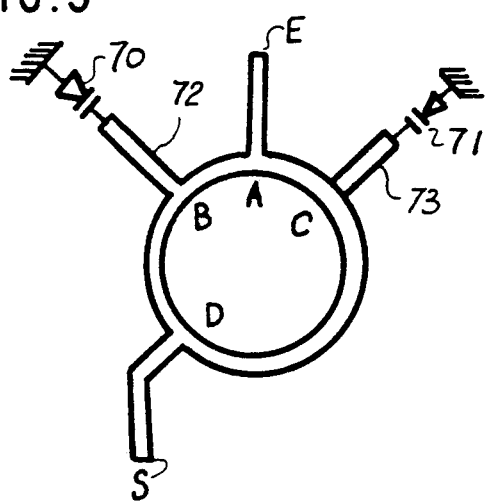
FIGS. 5 and 6 are diagrams of embodiments of phase shifters which can be used according to the invention.

It should be noted that a difference in the transfer functions between two detectors like the detectors 59, 61, 63 is likely to give rise to errors proportional to the difference in slope between these functions. It is therefore necessary to carry out a preliminary adjustment of equalization of the transfer parameters of all of the phase detectors. This equalization must remain monotonic in the operating frequency range of the system. In FIG. 5 there has been shown an embodiment of a variable phase shifter with a controllable phase. Use is made of the phenomenon of reflection of a microwave frequency wave on a capacitive element disposed at the end of a microwave frequency line of length determined with respect to the operating frequency band of the device. There is disposed at the end of the line a variable capacity constituted by a reverse biased varactor diode. The line is in fact a so-called 3 dB junction embodied by a 6λ/4 ring.

From the input E of the ring, which can be seen in FIG. 5, the microwave signal is divided into two in the branches B and C. The signals reflect on the varactors 70 and 71. In the path 72 coming from B there is disposed a length λ/4 in addition to the length of the path 73 coming from C. The result is that the signals reflected by the two varactors are phase-shifted on their return to B and C by 180°. Then, they are recombined in the path D with a total phase shift due to the phase shifts introduced by the varactors and due to the lengths of the lines in the ring.

It is thus possible to vary the phase shift by controlling the two varactors.

Figure 6:
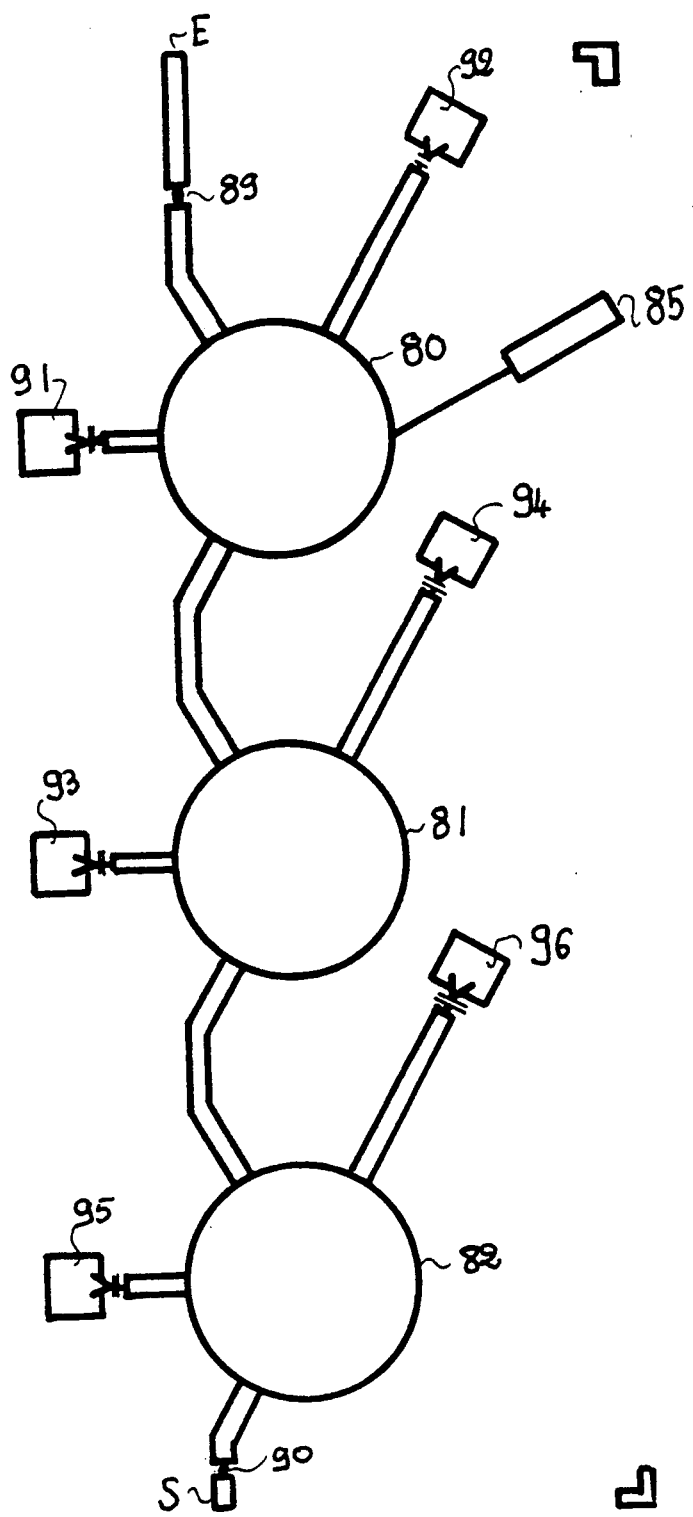

In FIG. 6 there has been shown a phase shifting circuit with three rings like the ring in FIG. 5 for the purpose of obtaining a sufficient phase excursion without leaving the frequency operating range of the circuit.

The input terminals E on the ring 80 and the output terminal S on the ring 82 are connected by capacitors 89 and 90 in such a way that, in the absence of a control signal, the phase shift introduced is zero. The capacities of the 6 varactors 83-88 are variable under the action of the control signal applied to the line 85. The terminals 91-96 receive the biassings of the diodes. The three rings shown, which can be greater in number, are connected in series, the input of the following ring being connected to the output of the previous ring in the series and being directed from the input to the output.

The result is that the proposed phase shifter allows an extremely fast phase correction and that furthermore it is capable of acting in a wide frequency range with an appropriate phase excursion.

We claim:

1. Device for correcting the phase induced by the class C operation of a solid state amplifier for producing microwave frequency waves for a radar transmitter, wherein the amplification system to be corrected comprises a phase shifter (12) disposed at the input of the amplifier (13) which is controlled by the detection (22) of an instantaneous phase difference between an input voltage and an output voltage of the amplifier (13), wherein the control signal to the phase shifter is supplied by the output of an amplifier (23) which compares the input/output transfer phase variation coming from a phase detector (22) with a signal coming from a voltage source (27) which is adjustable about a pre-polarization value, in such a way as to allow a phase excursion about a central value.

2. Device according to claim 1, wherein an equalizing delay line (21) is introduced in the phase sensing path (20) of the input signal in order to balance out delays introduced by the amplification system (13, 16).

3. Device according to claim 1, wherein the correction is provided only in the medium power section (41) of an amplification system constituted from a series of amplification stages of increasing powers, the phase shift signals being measured separately over each power section (41-43) of the solid state amplification system.

4. Device according to claim 3, wherein each power section (41, 42, 43) comprises an amplifier (50, 53, 56) enclosed between two couplers, an input coupler (48, 52, 55) and an output coupler (51, 54, 57) which sample input signals delayed by delay lines (58, 60, 62) and output signals whose respective phase shifts are measured by phase detectors (59, 61, 63), the phase shift signals being combined in a device (45, 65) intended to control a phase shifter (49) of the controllable phase type inserted between the input coupler (48) of the first medium power stage (41) and the actual amplifier (50).

5. Device according to claim 4, wherein the composition device comprises a first adder (64) whose inputs receive the phase shift signals of the higher power stages (42, 43), and a pre-polarization signal from a voltage source (47), the resultant signal corresponding to a weighting of the various signals, the output (46) being connected to a first input of an amplifier (45), and the phase shift signal of the measurement system of the medium power stage (41) being supplied to a second input.

6. Device according to claim 1, wherein the phase shifter is of the hybrid ring type with two varactors (70, 71) and a control terminal which allows the provision of an output signal (S) phase-shifted with respect to the input signal.

7. Device according to claim 6, wherein the phase shifter comprises several rings connected in series in order to increase the phase excursion, the control signal being applied to the input of the microwave frequency line (85) disposed at a predetermined point on the ring (80) which bears the input terminal (E).

8. Radar system using a solid state amplifier microwave frequency generator, comprising a device for correcting phase variations according to one of the preceding claims.

* * * * *